United States Patent
Jenkins et al.

(10) Patent No.: US 9,791,500 B2
(45) Date of Patent: *Oct. 17, 2017

(54) CIRCUIT TO DETECT PREVIOUS USE OF COMPUTER CHIPS USING PASSIVE TEST WIRES

(71) Applicant: International Business Machines Corporation, Armonk, NY (US)

(72) Inventors: Keith A. Jenkins, Sleepy Hollow, NY (US); Barry P. Linder, Hastings-on-Hudson, NY (US); Kevin G. Stawiasz, Bethel, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 210 days.

This patent is subject to a terminal disclaimer.

(21) Appl. No.: 14/742,906

(22) Filed: Jun. 18, 2015

(65) Prior Publication Data

US 2016/0341788 A1 Nov. 24, 2016

Related U.S. Application Data

(63) Continuation of application No. 14/602,544, filed on Jan. 22, 2015.
(Continued)

(51) Int. Cl.
*G01R 31/28* (2006.01)
*G01R 31/02* (2006.01)
(Continued)

(52) U.S. Cl.
CPC ....... *G01R 31/2853* (2013.01); *G01R 31/026* (2013.01); *G01R 31/2856* (2013.01);
(Continued)

(58) Field of Classification Search
CPC .............. G01R 31/2853; G01R 31/026; G01R 31/2856; G01R 31/2858; G06F 11/00; H01L 22/34
(Continued)

(56) References Cited

U.S. PATENT DOCUMENTS

| 6,559,483 | B2* | 5/2003 | Tao | H01L 23/5256 257/200 |
| 7,742,352 | B1* | 6/2010 | Hara | G11C 17/18 365/103 |
| 7,986,024 | B2* | 7/2011 | Nirschl | G11C 17/18 257/529 |

OTHER PUBLICATIONS

Keith A. Jenkins, et al."Circuit to Detect Previous Use of Computer Chips Using Passive Test Wires," U.S. Appl. No. 14/602,544, filed Jan. 22, 2015.
(Continued)

*Primary Examiner* — Melissa Koval
*Assistant Examiner* — Rahul Maini
(74) *Attorney, Agent, or Firm* — Cantor Colburn LLP; Vazken Alexanian

(57) ABSTRACT

A test structure and method to detect open circuits due to electromigration or burn-out in test wires and inter-level vias. Electromigration occurs when current flows through circuit wires leading to a circuit interruption within the wire. The test structure is a passive test wire arranged in one of several configurations within the circuit of a computer chip. The dimensions and resistances of test wires can vary according to the test structure configuration. Each test wire is measured for an electrical discontinuity after the computer chip is powered-on. If a wiring interruption is detected, it is concluded that the chip had been powered-on before.

8 Claims, 6 Drawing Sheets

Related U.S. Application Data

(60) Provisional application No. 62/000,632, filed on May 20, 2014.

(51) Int. Cl.
*G06F 11/00* (2006.01)
*H01L 21/66* (2006.01)

(52) U.S. Cl.
CPC .......... *G06F 11/00* (2013.01); *G01R 31/2858* (2013.01); *H01L 22/34* (2013.01)

(58) Field of Classification Search
USPC .................................................. 324/750.01
See application file for complete search history.

(56) References Cited

OTHER PUBLICATIONS

List of IBM Patents or Patents Applications Treated as Related; YOR920130304US3, Date Filed: Jun. 18, 2015, pp. 1-2.

* cited by examiner

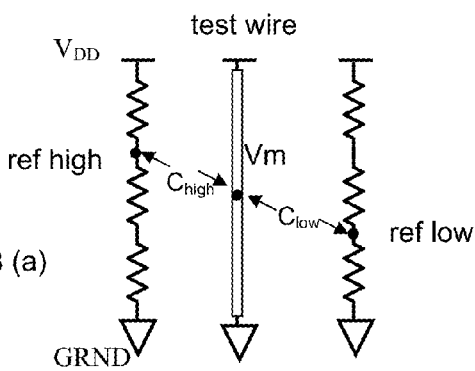
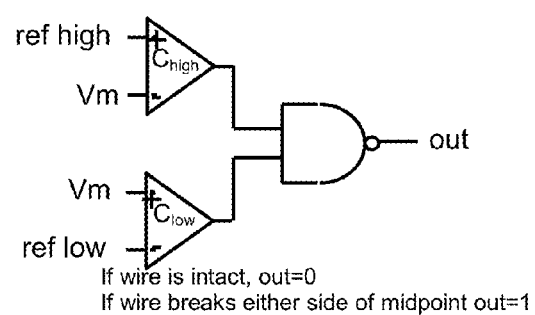
If wire is intact, out=0
If wire breaks either side of midpoint out=1
FIG. 3 (a)
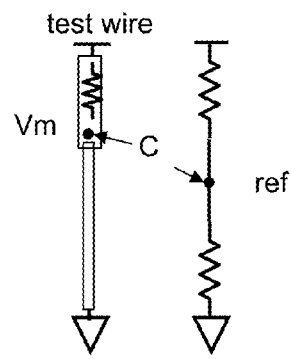
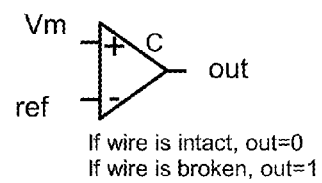
If wire is intact, out=0
If wire is broken, out=1
FIG. 3 (b)

CIRCUIT TO DETECT PREVIOUS USE OF COMPUTER CHIPS USING PASSIVE TEST WIRES

DOMESTIC PRIORITY

This application is a continuation of U.S. patent application Ser. No. 14/602,544, filed Jan. 22, 2015, which claims priority to U.S. Provisional Application No. 62/000,632, entitled "CIRCUIT TO DETECT PREVIOUS USE OF COMPUTER CHIPS USING PASSIVE TEST WIRES," filed May 20, 2014, which is incorporated herein by reference in its entirety.

GOVERNMENT RIGHTS

This invention was made with Government support under Contract No.: HR0011-11-C-0060 awarded by Defense Advanced Research Projects Agency (DARPA). The Government has certain rights in this invention.

BACKGROUND

The present invention relates generally to the field of semiconductor reliability monitoring. More specifically, the invention relates to circuits designed to detect whether a semiconductor chip has been used before.

The distribution of counterfeit semiconductor chips has become a serious and prevalent issue in recent years. The fear is that these counterfeits (particularly, used and relabeled commercial gear or components falsely labeled as military grade) will fail more quickly than the parts they are standing in for.

To prevent circulation of these types of semiconductor chips, various devices and methods have been created to determine the viability of the chip itself. Prior devices have focused on electromigration. Electromigration in an integrated circuit occurs whenever current flows through wires, and over time, eventually leads to an open circuit.

Prior methods and devices focus on predicting long-term failure of the chip, often times describing a method to monitor or predict circuit degradation with an on-chip monitor. However, none of these previous attempts provide a quick and reliable way to signal to a user that it has received a counterfeit chip, or a chip that has been previously used. In view of the foregoing, there exists a need for a device that provides simple, quick and effective detection of the chip's viability.

SUMMARY

One aspect of the present invention provides a test structure for detecting whether a computer chip has been previously used. The test structure includes a passive test wire extending between a voltage source and a ground to form a circuit integrated into the computer chip, where the passive test wire is a single passive test wire or an array of passive test wires, each passive test wire being the same or different and possessing varying dimensions and resistances, and where each passive test wire is measured for an electrical discontinuity after the computer chip is powered-on.

Another aspect of the present invention provides a method for detecting previous use of a computer chip by: applying a voltage to a passive test wire extending between a voltage source and a ground to form a circuit integrated into the computer chip, where the passive test wire is a single passive test wire or an array of passive test wires, each passive test wire being the same or different and possessing varying dimensions and resistances; and measuring the electrical discontinuity of the passive test wire to detect previous use of the computer chip.

Additional features are realized through the techniques of the aforementioned embodiments. Other embodiments are described in detail herein and are considered a part of what is claimed.

BRIEF DESCRIPTION OF THE DRAWINGS

FIG. 3(a) shows a schematic diagram of an exemplary embodiment of a test wire and a voltage comparator.

FIG. 3(b) shows a schematic diagram of another exemplary embodiment of a test wire and a voltage comparator.

DETAILED DESCRIPTION

Embodiments of the present invention include a passive test wire test structure and a method of using the passive test wire test structure to detect wiring interruptions or open circuits caused by electromigration or burn-out within the circuitry of a computer chip.

When first manufactured, the wires of a semiconductor chip are intact, and current can flow freely and uninterrupted from a power source to a ground. Over time, and after some current has passes through the chip, the wires are subject to electromigration, thereby creating interruptions by an open circuit. Detection of this open circuit indicates that power has been applied to the chip for some amount of time.

The test structure of the present invention makes it possible to detect the age or condition of a chip without using any reverse engineering, destructive physical analysis, or sophisticated test equipment. Through use of the test wire, one can detect if a chip's circuitry has ever been used. The period of detection is much shorter than devices found in the prior art as the test wires purposefully fail at very short times, and the method of detection does not attempt to monitor degradation on the chip itself.

Figure 1:
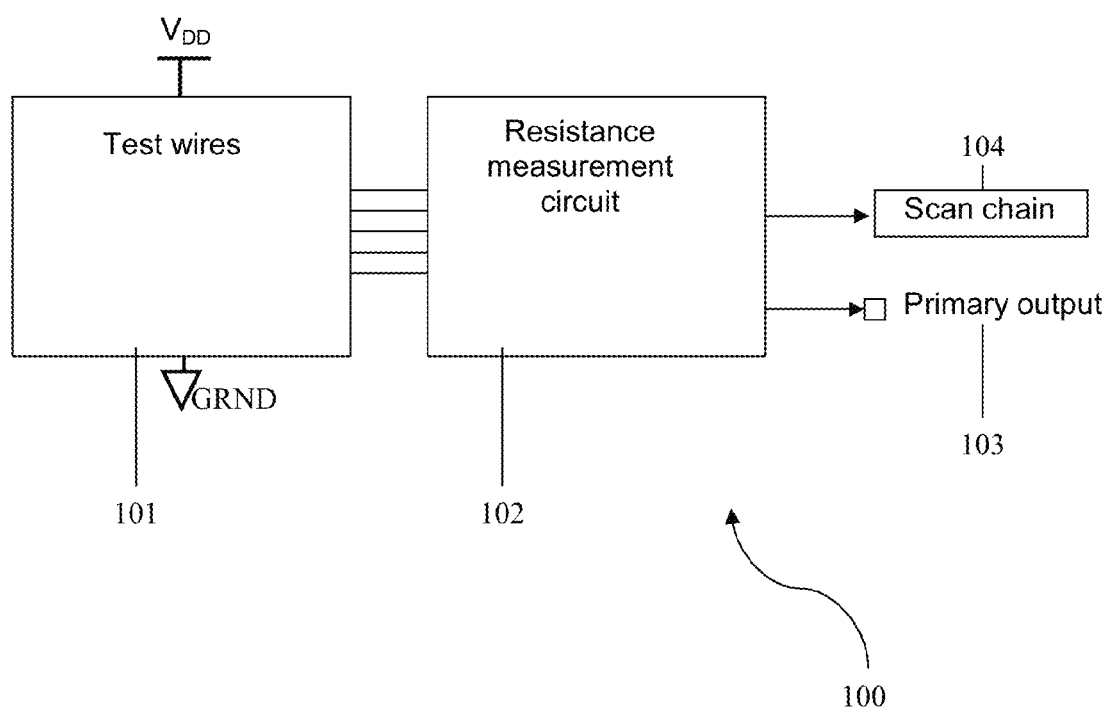
FIG. 1 shows a schematic diagram of a test wire with a resistance measurement circuit and output.

Referring to FIG. 1, an exemplary embodiment of test circuit 100 is shown. Test wire 101 connects to resistance measurement circuit 102 which transmits information to output 103. By establishing a connection between test wire 101 and resistance measurement circuit 102, test circuit 100 can be understood, generally, as an open-circuit measurement circuit. The circuit detects large, and in some cases infinite, increases in the resistance of the test wires.

All test wires used in the present invention are passive test wires; in other words, test wire 101 is activated only by applying to the chip voltage, or powering-on the chip. Therefore, the invention is tamper-proof in that there are no switches to operate for the measurement of voltages. Test wire 101 is integrated directly into a semiconductor chip during the manufacturing stage of the chip and is independent of the chip, as the circuit only requires that the chip be powered to detect prior use.

As is shown in later embodiments, arrangements of test wire 101 within the open circuit measurement system can include a single test wire, or an array of test wires. Test wire 101 can be of different lengths, widths, or thicknesses. Test wire 101 can be made of any conductive or semi-conductive material, such as aluminum, copper or other materials typically used on the gate electrode of a field-effect transistor. Additionally, test wire 101 can be made of a silicide material, for example, a polysilicon combined with metal, e.g., titanium silicide or cobalt.

Test wire 101 is connected between a power source, $V_{DD}$, and a ground, GRND. The output of resistance measurement circuit 102 can be transmitted to digital readout output 103 so its value can always be known, or it can be set to register in scan chain 104. Though an optional feature of the invention, if used, scan chain 104 permits monitoring of the output at various points in time, as determined by the chip's tester.

Because of the well-known electromigration problem, circuit wires within a computer chip are generally designed following guidelines which ensure that they will not open during the expected lifetime of the chip, typically ten years. From what is known of the current, temperature, and resistance dependence of electromigration in wires, the test wires of the present invention were developed using physical design guidelines that guarantee that they will open in a fairly short amount of time. As electromigration in an integrated circuit occurs because of current flow, the test wires are designed so that sufficient current flows through them to insure that they will open after some specified time.

The design of each test structure described herein is based on two premises: (i) the resistance associated with a test wire is such that a current passing through it is large enough to cause an open; and (ii) the dimensions of the test wire are such that the current will cause an open in a specified time.

Figure 2:
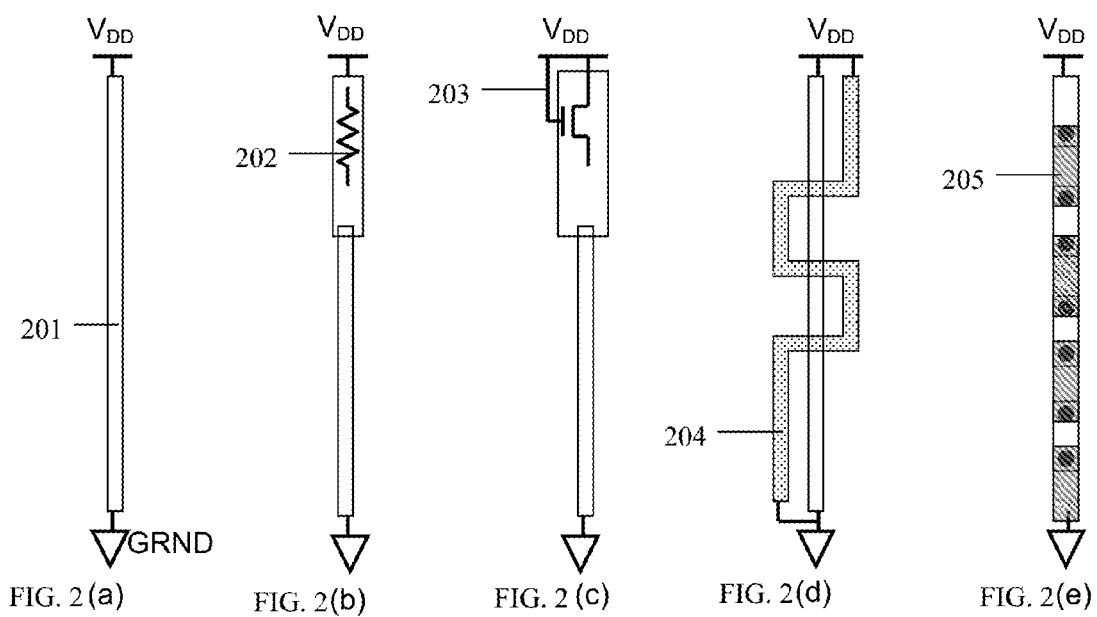
FIG. 2(a) shows a test wire connected between a power source and a ground.
FIG. 2(b) shows a test wire with a current-limiting resistor, connected between a power source and a ground.
FIG. 2(c) shows a test wire with a current-limiting field effect transistor, connected between a power source and a ground.
FIG. 2(d) shows an arrangement of a test wire and heating wire.
FIG. 2(e) shows a chain of inter-level vias linking a series of short test wires connected between a power source and a ground.

FIG. 2 illustrates several examples of test wires that can be implemented with the present invention. According to the present invention, there are three mechanisms that cause the test wires to open when the computer chip is powered: electromigration of circuit wiring of the computer chip and moreover, this would be accelerated by the use of a heating wire in the test structure as depicted in FIG. 2(d); a fuse opening in polysilicon wiring, using the test structures depicted in FIGS. 2(a)-(d); and the opening of vias using the test structure depicted in FIG. 2(e).

Test wire 201, as shown in FIG. 2(a), is shown as a single, unitary wire, connected between a power source, $V_{DD}$, and a ground. The resistance of test wire 201 is an inherent one, determined by the dimensions of the test wire.

FIGS. 2(b)-2(e) represent exemplary test structures using test wire 201 but are not numbered as such for brevity. FIG. 2(b) shows a test structure that includes current-limiting resistor 202. In this arrangement, current-limiting resistor 202 can be placed at one or both ends of the test wire. FIG. 2(c) shows another test structure which includes current-limiting field-effect transistor (FET) 203. Current-limiting FET 203 can be placed at one of both ends of the test wire.

FIG. 2(d) shows a test structure similar to that of FIG. 2(a), and includes heating wire 204. Heating wire 204 can be arranged as to pass over or under the test wire. Based on the relationship between temperature and resistance of a wire, heating wire 204 is used to accelerate the electromigration process within the test wire. FIG. 2(e) shows a chain of inter-level vias 205 linking shorter test wires connecting power to a ground. Inter-level vias 205 also burn out and become open-circuited after excessive current flows through them.

The present invention also provides a simple and accurate method to determine whether a semiconductor chip has been used previously. The method includes the steps of applying a voltage to the test wire of the test circuit by powering-on the computer chip being tested and then measuring the electrical discontinuity of the test wire. The test structures, arranged with an open circuit measurement circuit, can be connected to a readout. Depending on the tester's objective, the readout can provide information on (i) whether the computer chip has been previously used, through the single test wire embodiment (introduced above and described in more detail below), or (ii) how long the computer chip was used in the past through the test wire array arrangement (described below).

The present invention envisions the detecting of an electrical discontinuity, or open circuit, in one of two ways: by comparing the current through the test wire to a reference current, using a current comparator, or by measuring a voltage at a point on the test wire and comparing it to a voltage on a reference resistor. Although the exemplary embodiments and their respective descriptions herein depict ways of obtaining current and/or voltage measurements, it is understood that those skilled in the art can appreciate that other forms of current or voltage measurement can be implemented with the present invention.

Figure 4:
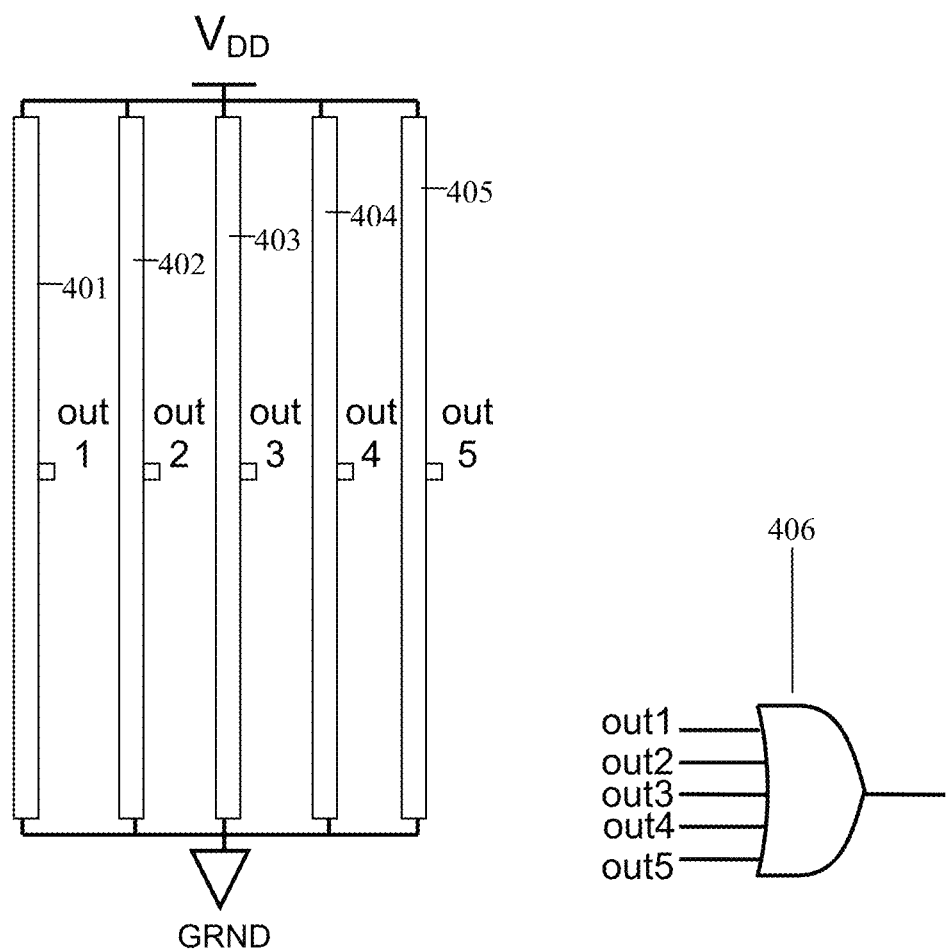
FIG. 4 shows an array of test wires connected to a series of outputs.
Figure 5:
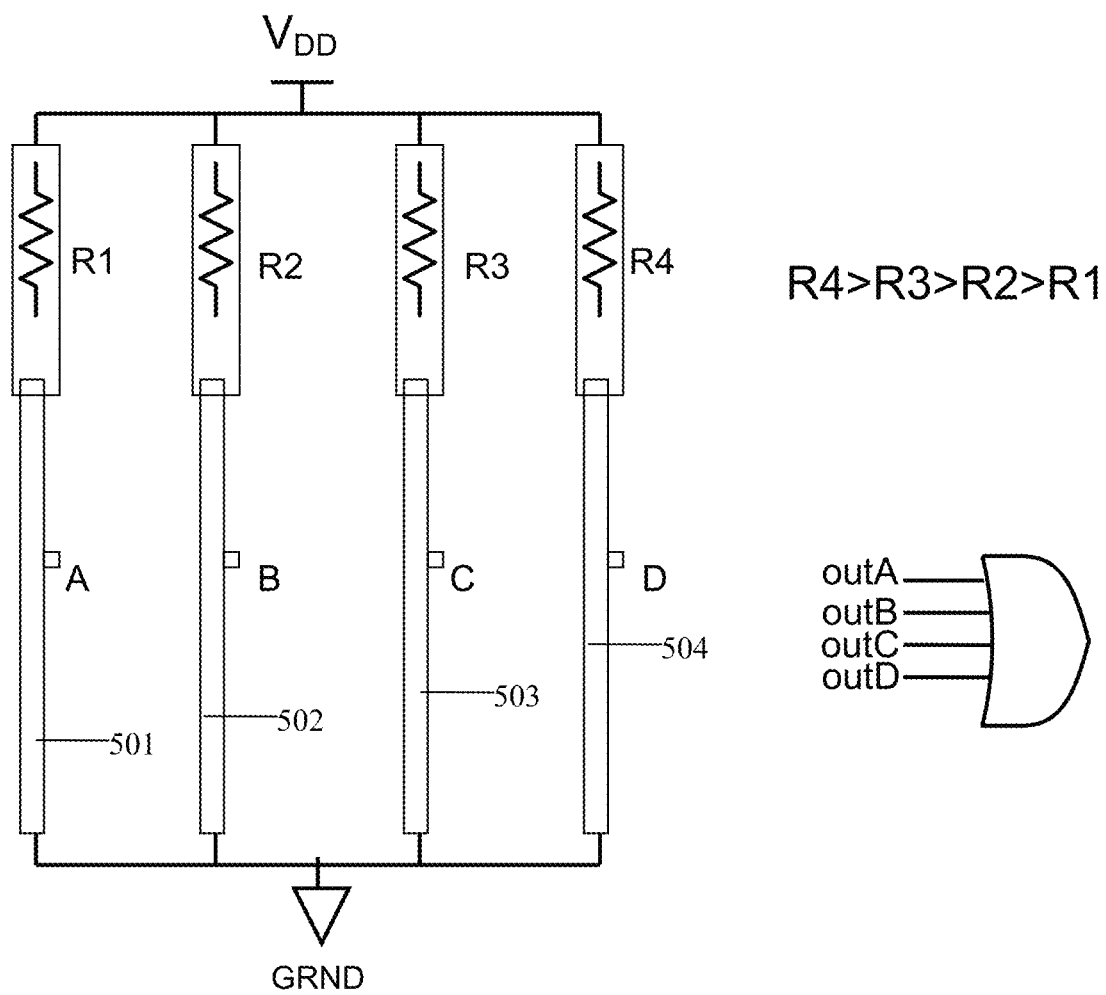
FIG. 5 shows an array of test wires with varying resistances, connected between power source and a ground.

FIGS. 3-5 show several ways the test structures can detect an open circuit within a computer chip. Referring generally to FIG. 3, a point on the test wire connects to an input of a voltage comparator. A voltage is measured from that point on the test wire at which point, that measured voltage is compared to a reference voltage. The value for the reference voltage is obtained from another input of the voltage comparator. If the value of the measured voltage is less than the reference voltage, this represents that the test wire contains an open circuit and that the chip has been used previously. If the measured voltage is equivalent to the reference voltage, the test wire is intact and the chip has not been used previously.

Based on each of these conditions, the test circuit generates an output signal. The test circuit can indicate to the tester, by way of a digital readout connected to the test circuit, whether the test wire contains an open, or is instead intact, by outputting a "1" or "0," respectively.

FIG. 3(a) shows an exemplary embodiment of the method of the present invention through use of voltage comparators. A point on the test wire, $V_m$, is one input to a voltage comparator. The other input to the comparator is a reference voltage created by a resistive divider. The voltage at the center of the test wire, if it conducts current, is expected to be $V_{DD}/2$. $V_{DD}$ represents the voltage applied from the power source to the test wire.

If an open circuit is created, the voltage will either go to $V_{DD}$ or GRND, according to the physical location of the open. Using a pair of comparators, where one has a relatively high reference voltage, ref high, and the other a low reference voltage, ref low, a signal is generated which indicates the open condition, if any.

The reference levels are set by the inherent design of the resistors. For example, the resistors may all be the same value, so that the high reference voltage value would be ⅔ $V_{DD}$ and the low reference value would be ⅓ $V_{DD}$. Both the high and low reference voltages are above a ground but below $V_{DD}$ as to account for the voltage offset of the comparator.

FIG. 3(b) shows a similar arrangement for the test wire shown in FIG. 2(b). Here a single reference voltage is used. A current-limiting resistor is connected to the test wire; power is applied to the test wire after the powering-on of the computer chip; the voltage at a point on the test wire is compared to a reference voltage; based on the value compared, the circuit generates a signal for the output which is either a "0" or "1."

If the test wire is intact, output="0," which represents that current is flowing through the test wire and the chip has not been previously used or suffered from burn out or electromigration.

If the wire contains an open circuit, output="1" which represents that the wire has suffered from electromigration or a fuse opening, if using a test structure found in FIGS. 2(a)-2(d), or the opening of vias, if using a test structure found in FIG. 2(e).

The present invention also envisions an arrangement with an array of test wires as shown in FIGS. 4 and 5. In the case of multiple test wires, each test wire can be identical in size. If this arrangement is chosen, each test wire would open simultaneously. However, the test wires can also be sized in such a manner as to open after different power-on times. Through the varying of the dimensions (i.e., length, width, thickness) of the test wire, and thereby, resistances of the test wires, the tester can set a specific number of wires that corresponds to an open circuit.

For example, FIG. 4 illustrates an embodiment that includes test wires 401, 402, 403, 404, 405. Each test wire is connected to output 406 through out1, out2, out3, out4, and out5 to permit output of a signal related to the existence of an open circuit. The resistance of each test wire, 401, 402, 403, 404, 405 is based on the specific dimensions of each wire. If power were applied, test wire 401 could be arranged to open first, based on a low resistance that comes as a result of its narrow and thin construction.

Test wires 402, 403, 404, 405 can have relatively higher resistances—each wire being of a different length, width, and thickness, and thus, different resistances. As more power is applied, if three of the five test wires generated a signal that indicated an open circuit, then the user knows that the specific computer chip being tested has not only been used previously, but for some extended period of time. Where an array or multiple arrays of test wire are used, each test wire is connected to its own resistance detection circuit. The output of each circuit is then connected to an additional logic circuit.

As illustrated in FIG. 4, one form of a logic circuit that can be used is an "OR" circuit. The logic circuit develops a signal when the first of the test wires opens due to power-on current. This provides redundancy and the earliest possible detection. Other logic circuits can also be used, such as a voting circuit. Use of a voting circuit notifies the user, through an output, that some number of test wires, greater than one, is open.

FIG. 5 shows another example of an arrangement using an array of test wires 501, 502, 503, 504. Power supplied from $V_{DD}$ creates a current through each test wire. Here, rather than the resistance of each test wire being dependent simply on the dimensions of the individual test wire, the current that flows through each test wire depends on the resistors attached to each test wire. As shown, each test wire can experience a different current, as determined by four current-limiting resistors, R1, R2, R3, R4, that have different resistances.

As with each test structure, a circuit connected to the test wires generates a signal based on the current flowing through each test wire. In this embodiment, the test wires will open at different times, according to a current comparator and the current passing through the test wire. If current flows through the test wire, the output reads out "0"; if there is no current flowing through the wire or a current is present that is lower than a reference voltage it would compared to, the output reads out "1" which informs the user that the chip has been used.

As described above with other test structures of the present invention, the embodiment of FIG. 5 indicates to the user not only that the chip has been powered-on at some point in the past, but also gives an approximate indication of the amount of time that the chip has been powered-on.

Figure 6:
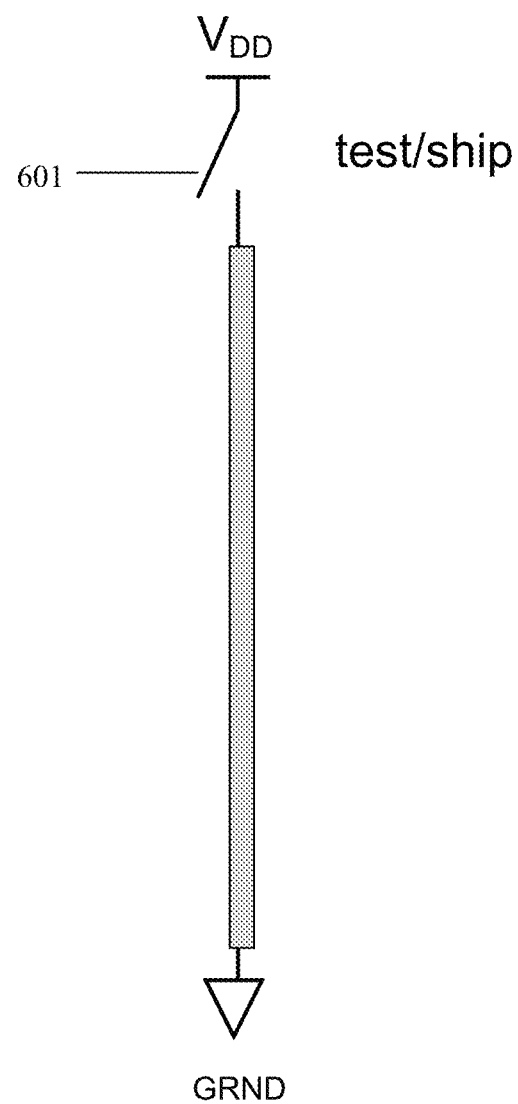
FIG. 6 shows an arrangement of a test wire and switch, connected between power source and a ground.

In FIG. 6, the present invention also envisions an alternative structure to be used in testing a computer chip—a test wire connected to a switch. This arrangement of the test wire and switch prevents the test wire from being subject to voltage during test time. Switch 601, an optional feature, can be built into each of the test structures. Each test wire can have switch 601, which would be open during test time and then permanently closed at the end of the test, for example, at the time the device is being shipped. The present invention can be used to test a chip before it is shipped to any person or entity in the supply chain or at any point thereafter.

As mentioned above and as shown in FIG. 1, all embodiments of the present invention can include scan chain 104. A user can create a specific time increment and set outputs of the test circuit to register in scan chain 104 to permit time-variable tracking of outputs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for detecting previous use of a computer chip, the method comprising the steps of:
    applying a voltage to an array of passive test wires extending between a voltage source and a ground to form a circuit integrated into the computer chip, wherein each passive test wire of the array of test wires is of a different length, width, or thickness, such that each of the passive test wires remains continuous for a different amount of time upon an application of power;
    measuring the electrical discontinuity of each of the passive test wires to detect previous use of the computer chip; and
    wherein each of the passive test wires is configured to be activated only by applying power to the computer chip for a specified amount of time, such that the electrical discontinuity occurs only if the computer chip was used for the specified amount of time;

the array of passive test wires is coupled to a logic circuit; and the logic circuit is arranged to determine a length of time the computer chip was previously in use based on the current flowing through each of the passive test wires.

2. The method of claim 1, wherein the step of measuring the electrical discontinuity of the passive test wire further comprises the steps of:

connecting the passive test wire to open-circuit measurement circuit; and providing information to a digital output about a current flowing through the passive test wire.

3. The method of claim 1, further comprising the step of connecting the passive test wire to a current-limiting resistor.

4. The method of claim 1, further comprising the step of connecting the passive test wire to a current-limiting FET.

5. The method of claim 1, further comprising the step of connecting the passive test wire to a switch.

6. The method of claim 1, further comprising the step of placing the passive test wire in proximity to a heating wire.

7. The method of claim 1, wherein the step of measuring further comprises the steps of:

comparing a current flowing through the passive test wire to that of a reference current with a current comparator; and generating a logical output signal in the form of a "0" or "1" based on the comparison of the current flowing through the passive test wire and the reference current.

8. The method of claim 1, wherein the step of measuring further comprises the steps of:

connecting a point on the passive test wire to a first input of a voltage comparator;

measuring a voltage from that point on the passive test wire;

comparing the voltage against a reference voltage of a second input of the voltage comparator; and generating a logical output signal in the form of a "0" or "1" based on the comparison of the voltage and the reference voltage.

* * * * *